(12) United States Patent
Lee et al.

(10) Patent No.: US 10,600,809 B2
(45) Date of Patent: Mar. 24, 2020

(54) SEMICONDUCTOR STRUCTURE AND METHOD FOR MANUFACTURING THE SAME

(71) Applicant: Vanguard International Semiconductor Corporation, Hsinchu (TW)

(72) Inventors: Tsung-Hsiung Lee, Taoyuan (TW); Chun-Ting Yang, New Taipei (TW); Ho-Chien Chen, Keelung (TW); Yu-Ting Wei, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 44 days.

(21) Appl. No.: 15/431,351

(22) Filed: Feb. 13, 2017

(65) Prior Publication Data
US 2018/0233514 A1  Aug. 16, 2018

(51) Int. Cl.
| | | |
|---|---|---|
| H01L 27/12 | (2006.01) | |
| H01L 29/06 | (2006.01) | |
| H01L 29/10 | (2006.01) | |
| H01L 21/762 | (2006.01) | |
| H01L 21/74 | (2006.01) | |
| H01L 29/78 | (2006.01) | |
| H01L 29/66 | (2006.01) | |
| H01L 21/265 | (2006.01) | |

(52) U.S. Cl.
CPC ........ *H01L 27/1203* (2013.01); *H01L 21/743* (2013.01); *H01L 21/76283* (2013.01); *H01L 29/0649* (2013.01); *H01L 29/1083* (2013.01); *H01L 29/1087* (2013.01); *H01L 29/66681* (2013.01); *H01L 29/7824* (2013.01); *H01L 21/26586* (2013.01)

(58) Field of Classification Search
CPC .......... H01L 27/1203; H01L 21/76898; H01L 21/76283; H01L 21/26513; H01L 21/84; H01L 21/76877; H01L 29/0649; H01L 29/1087; H01L 29/1083; H01L 29/66681; H01L 29/7824
See application file for complete search history.

(56) References Cited

U.S. PATENT DOCUMENTS

| | | | | |
|---|---|---|---|---|
| 2001/0033001 A1* | 10/2001 | Kato | ................... | H01L 27/1203 257/347 |
| 2007/0045767 A1* | 3/2007 | Zhu | ..................... | H01L 23/3677 257/505 |
| 2008/0191788 A1* | 8/2008 | Chen | ................. | H01L 29/66772 327/537 |
| 2011/0156093 A1 | 6/2011 | Lerner | | |

(Continued)

*Primary Examiner* — Yosef Gebreyesus
(74) *Attorney, Agent, or Firm* — Birch, Stewart, Kolasch & Birch, LLP

(57) ABSTRACT

The present disclosure relates to a semiconductor structure. The semiconductor structure includes a semiconductor-on-insulator (SOI) substrate having a bottom substrate, a buried oxide layer disposed on the bottom substrate, and a semiconductor layer disposed on the buried oxide layer. The semiconductor structure further includes a doped layer embedded in the semiconductor layer and above the buried oxide layer, and a contact structure extending into the semiconductor layer from the top surface of the semiconductor layer. The contact structure is electrically connected to the doped layer.

21 Claims, 6 Drawing Sheets

(56) References Cited

U.S. PATENT DOCUMENTS

| | | | |
|---|---|---|---|
| 2014/0110814 A1* | 4/2014 | Lin | H01L 29/66356 257/492 |
| 2014/0367830 A1* | 12/2014 | Zhan | H01L 27/0262 257/577 |
| 2015/0097240 A1* | 4/2015 | Verma | H01L 29/78657 257/347 |
| 2016/0035899 A1* | 2/2016 | Stulemeijer | H01L 29/78606 327/534 |
| 2016/0111516 A1* | 4/2016 | Hong | H01L 29/7841 257/347 |
| 2017/0323942 A1* | 11/2017 | Voldman | H01L 29/1083 |

\* cited by examiner

SEMICONDUCTOR STRUCTURE AND METHOD FOR MANUFACTURING THE SAME

BACKGROUND

The present disclosure relates to a semiconductor structure, and in particular it relates to a semiconductor structure that includes a semiconductor on an insulator (SOI) substrate.

Semiconductor structures are used in a variety of electronic applications, such as personal computers, cell phones, digital cameras, and other electronic devices. These semiconductor structures are typically fabricated by depositing an insulating layer or dielectric layer, a conductive layer material, and a semiconductor layer material on the semiconductor substrate in sequence, followed by patterning the various material layers by using a photolithography process. Therefore, the circuit devices and components are formed on the semiconductor substrate.

Semiconductor structures including SOI substrates are promising in the semiconductor industry because they have the potential advantages of fast operation, low power loss, latch-up immunity, a simplified manufacturing processes, and small dimensions.

When SOI devices are used, it is sometimes desirable for voltage to be applied to the bottom substrate thereof. However, when voltage is applied to the bottom substrate of a conventional SOI semiconductor device, charges are coupled above the oxide layer (i.e. the back side bias effect), which affects the electric field distribution of the device and the properties of the device during operation. Therefore, existing technologies do not fully meet all requirements, and some improvements are necessary.

SUMMARY

In some embodiments, the present disclosure relates to a semiconductor structure. The semiconductor structure includes a semiconductor-on-insulator (SOI) substrate having a bottom substrate, a buried oxide layer disposed on the bottom substrate, and a semiconductor layer disposed on the buried oxide layer. The semiconductor structure further includes a doped layer embedded in the semiconductor layer and above the buried oxide layer, and a contact structure extending into the semiconductor layer from a top surface of the semiconductor layer. The contact structure is electrically connected to the doped layer.

In other embodiments, the present disclosure relates to a method for manufacturing a semiconductor structure. The method includes providing a semiconductor on an insulator substrate having a bottom substrate, a buried oxide layer on the bottom substrate, and a semiconductor layer on the buried oxide layer; forming a doped layer on the semiconductor layer; forming an epitaxial layer on the doped layer; forming a trench isolation structure extending through the doped layer; and forming a contact structure. The contact structure extends into the epitaxial layer from a top surface of the epitaxial layer and is electrically connected to the doped layer.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. It should be understood that additional steps can be implemented before, during, or after the illustrated methods, and some steps might be replaced or omitted in other embodiments of the illustrated methods.

The semiconductor structure of the present disclosure can discharge the coupled charges above the oxide layer through a doped layer and a contact structure electrically connected to the doped layer. Therefore, the back side bias effect can be reduced or eliminated. In addition, in some embodiments, a voltage of the bottom substrate can be applied to or adjusted from the front side of the semiconductor structure through the contact structure.

Figure 1A:
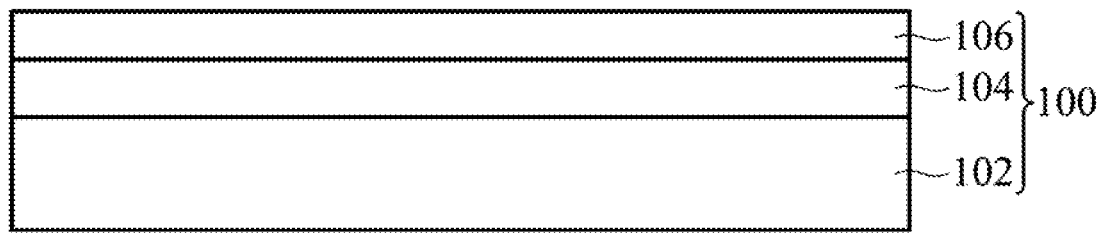
FIG. 1A is one of a series of cross-sectional views which illustrate a process for manufacturing a semiconductor structure according to some embodiments of the present disclosure.

FIG. 1A illustrates the initial step of the illustrated embodiment. First, a SOI substrate 100 is provided. The substrate 100 includes a bottom substrate 102 with a first side (or front side) and a second side (or back side) which is opposite to the first side, a buried oxide layer 104 disposed on the first side of the bottom substrate 102, and a semiconductor layer 106 disposed on the buried oxide layer 104. For example, the bottom substrate 102 and the semiconductor layer 106 may respectively include silicon (Si), and the buried oxide layer 104 may include silicon oxide ($SiO_2$). In other embodiments, the semiconductor layer 106 may include other elementary semiconductor materials such as germanium (Ge). In some embodiments the semiconductor layer 106 may include compound semiconductor such as silicon carbide (SiC), gallium arsenic (GaAs), indium arsenide (InAs), or indium phosphide (InP). In some embodiments the semiconductor layer 106 may include alloy semiconductor such as silicon germanium (SiGe), silicon germanium carbide (SiGeC), gallium arsenic phosphide (GaAsP), or gallium indium phosphide (GaInP).

Figure 1B:
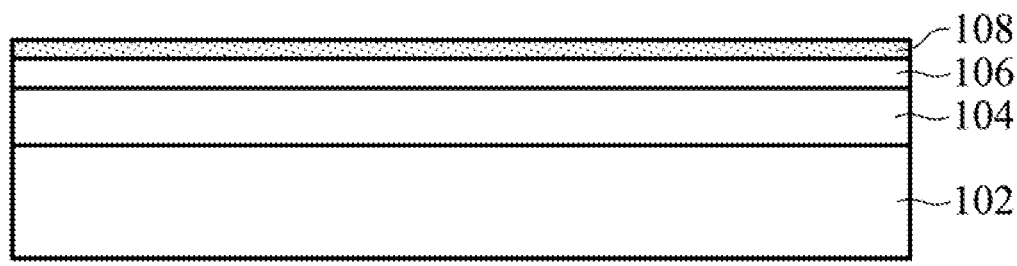
FIG. 1B is one of a series of cross-sectional views which illustrate a process for manufacturing a semiconductor structure according to some embodiments of the present disclosure.

Then, as shown in FIG. 1B, a doped layer 108 is formed by implanting dopants into the semiconductor layer 106. The conductive type of the doped layer 108 depends on the conductive type of the semiconductor device 112 (as shown in FIG. 1D) which is formed in a subsequent step. In the illustrated embodiment, the semiconductor device 112 is an N-type device, and thus the doped layer 108 has N-type dopants. For example, the N-type doped layer 108 can have a dopant concentration of $10^{11}$-$10^{13}$ cm$^{-3}$, and can be formed by implanting phosphorous ions or arsenic ions into a portion of the semiconductor layer 106. In other embodiments, the semiconductor device 112 is a P-type device, and thus the doped layer 108 has P-type dopants. For example, the P-type doped layer 108 can have a dopant concentration of $10^{11}$-$10^{13}$ cm$^{-3}$, and can be formed by implanting boron ions, indium ions, or boron difluoride ions ($BF2^+$) into a portion of the semiconductor layer 106. In some embodiments, the doped layer 108 can have a thickness of 0.5-2 um, but is it not limited to this range.

Figure 1C:
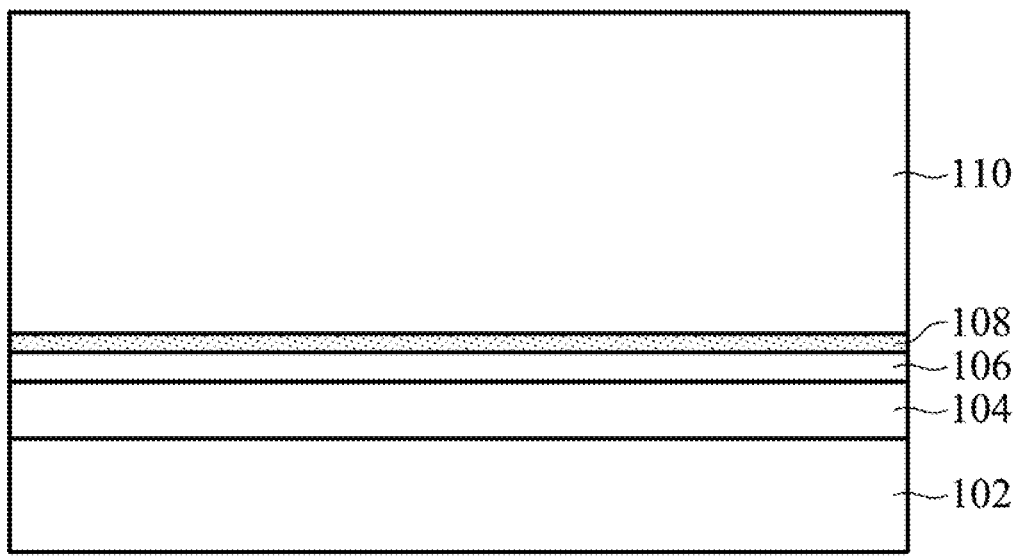
FIG. 1C is one of a series of cross-sectional views which illustrate a process for manufacturing a semiconductor structure according to some embodiments of the present disclosure.
Figure 1D:
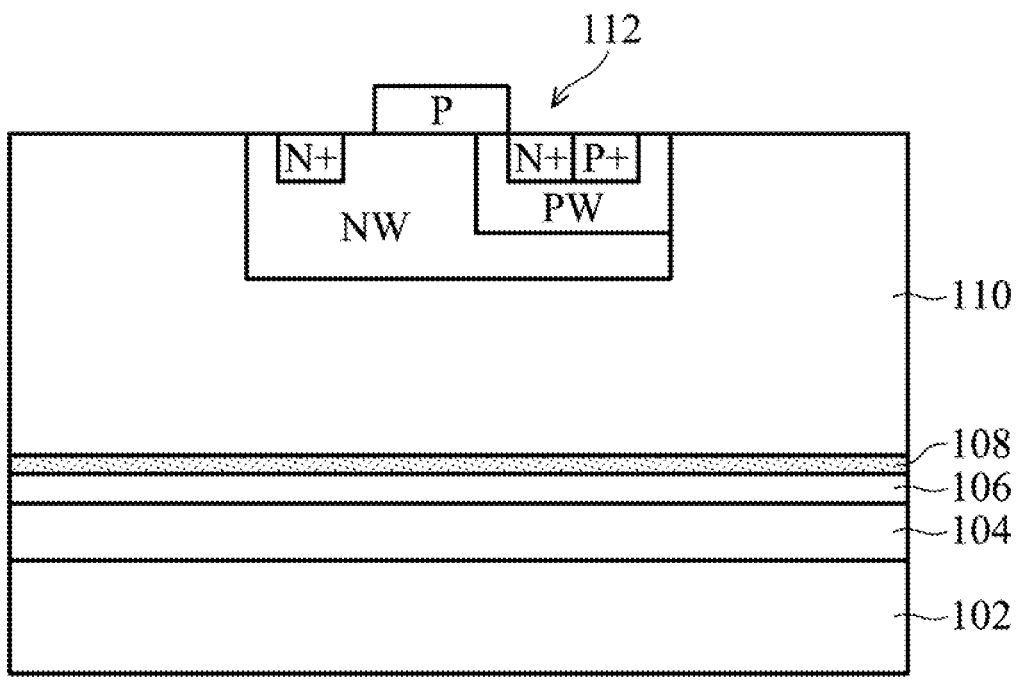
FIG. 1D is one of a series of cross-sectional views which illustrate a process for manufacturing a semiconductor structure according to some embodiments of the present disclosure.

Then, as shown in FIG. 1C, an epitaxial layer 110 is formed on the doped layer 108. The epitaxial layer 110 can be epitaxial silicon. For example, the epitaxial layer 110 can be formed using a vapor phase epitaxy process (VPE), a molecular-beam epitaxy process (MBE), a metal organic chemical vapor deposition process (MOCVD), a combination thereof, or another suitable process.

Then, as shown in FIG. 1D, a semiconductor device 112 is formed on the epitaxial layer 110. The semiconductor device 112 can include various active devices, passive devices, other suitable semiconductor devices, or a combination thereof. For example, the active devices can include various types of transistors (e.g., metal-oxide-semiconductor field-effect transistor, complementary metal-oxide-semiconductor transistor, bipolar junction transistor, high voltage transistor, high-frequency transistor, or lateral diffused metal-oxide semiconductor field-effect transistor) or diodes. The passive devices can include resistors or capacitors. Various processes (e.g., deposition, etching, implantation, lithography, annealing, and/or another suitable process) can be performed to form the semiconductor device 112. An N-type lateral diffused metal-oxide semiconductor field-effect transistor (LDMOS) is used as an example of the semiconductor device 112 in the illustrated embodiment, and it includes poly silicon P, n-doped regions and p-doped regions.

Figure 1E:
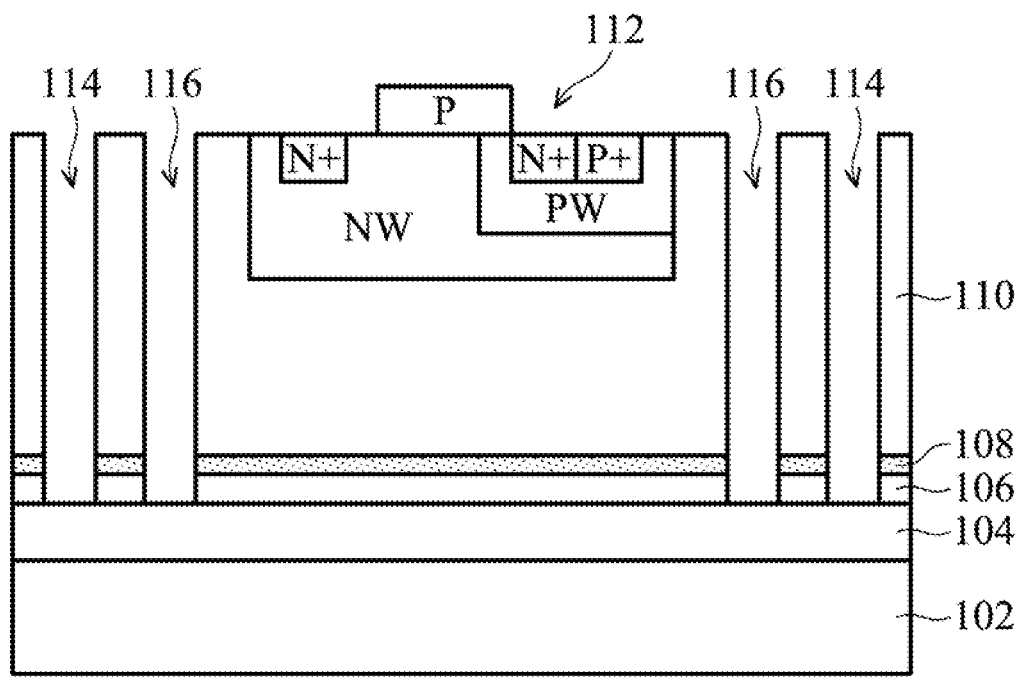
FIG. 1E is one of a series of cross-sectional views which illustrate a process for manufacturing a semiconductor structure according to some embodiments of the present disclosure.

Then, referring to FIG. 1E, a first trench 114 and a second trench 116 are formed. In subsequent steps, the first trench 114 is used to form a trench isolation structure, and the second trench 116 is used to form a contact structure. As shown in FIG. 1E, the first trench 114 and the second trench 116 extend from a top surface of the epitaxial layer 110 into the epitaxial layer 110 and through the doped layer 108 to expose a top surface of the buried oxide layer 104. The second trench 116 is between the first trench 114 and the semiconductor device 112. Each of the first trench 114 and the second trench 116 can be ring-shaped, round, rectangular, or another suitable shape from a top view. As shown in FIG. 1H, in some embodiments, the first trench 114 and the second trench 116 are ring-shaped structures surrounding the semiconductor device 112. For example, a patterned photoresist or a patterned hard mask (not illustrated) formed on the epitaxial layer 110 can be used as an etching mask to perform an etching process to form the first trench 114 and the second trench 116. The etching process can be a dry etching process (e.g., an anisotropic plasma etching method), a wet etching process, or a combination thereof. In some embodiments, it is beneficial to use the dry etching process to form the first trench 114 and the second trench 116 with high aspect ratios.

The second trench 116 exposes the top surface of the buried oxide layer 104 in FIG. 1E. However, in other embodiments, the second trench 106 can extend through the doped layer 108 without exposing the top surface of the buried oxide layer 104. In other embodiments, the second trench 116 can extend through the doped layer 108 and the buried oxide layer 104 to expose a top surface of the bottom substrate 102.

Figure 1F:
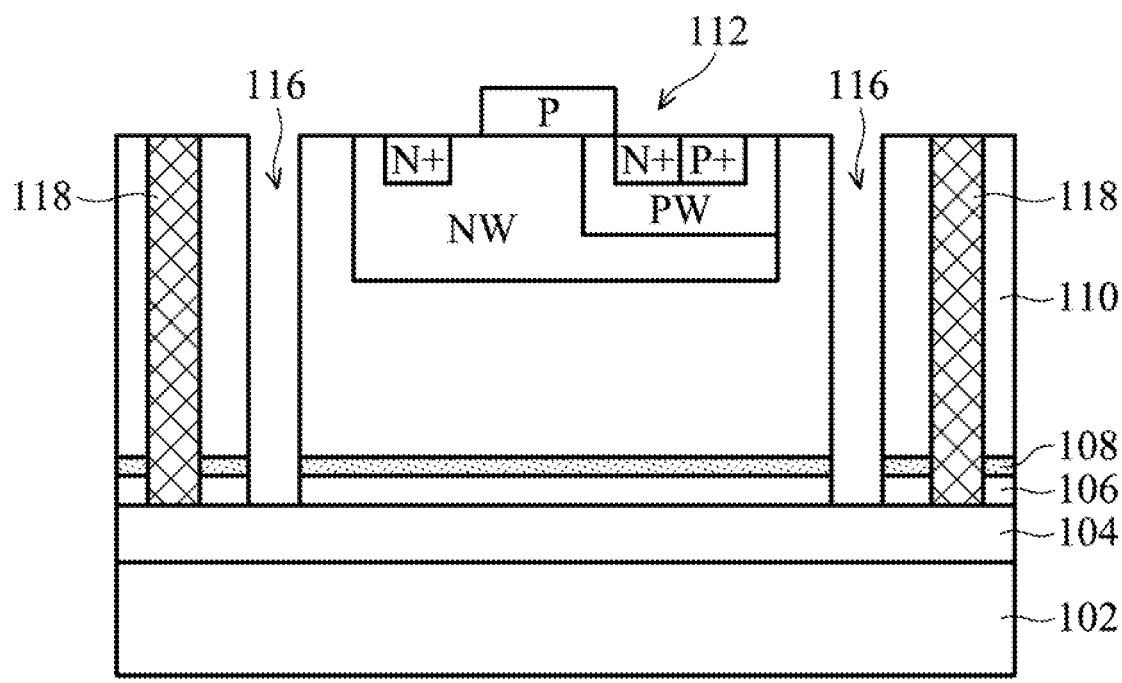
FIG. 1F is one of a series of cross-sectional views which illustrate a process for manufacturing a semiconductor structure according to some embodiments of the present disclosure.

Then, as shown in FIG. 1F, the first trench 114 is filled by an insulating material to form a trench isolation structure 118. For example, silicon oxide, high-density plasma oxide, silicon nitride, silicon oxynitride, fluorosilicate glass, low-k (low dielectric constant) dielectric material, and/or another suitable insulating material can be used to form the trench isolation structure 118. For example, the trench isolation structure 118 can be formed using a chemical vapor deposition process, a plasma enhanced chemical vapor deposition process, another suitable process, or a combination thereof.

Figure 1G:
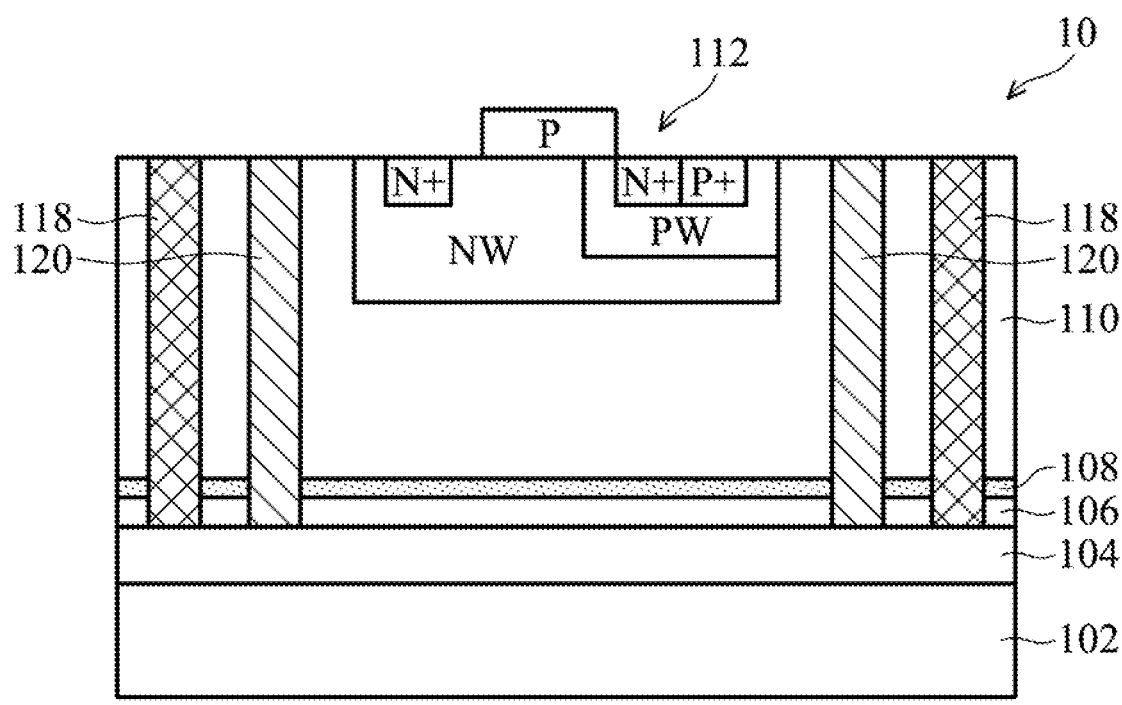
FIG. 1G is one of a series of cross-sectional views which illustrate a process for manufacturing a semiconductor structure according to some embodiments of the present disclosure.
Figure 1H:
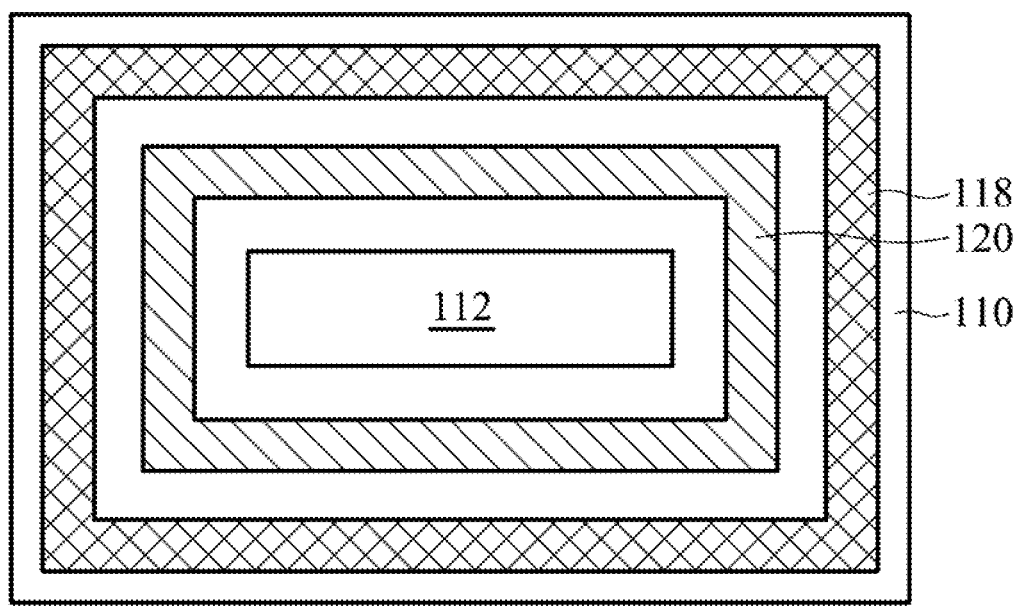
FIG. 1H is a top view of a semiconductor structure according to some embodiments of the present disclosure.

Then, referring to FIG. 1G, the second trench 116 is filled by a conductive material to form a contact structure 120. For example, the contact structure can be formed with metal materials (e.g., tungsten, aluminum, or copper), metal alloys, poly silicon, or another suitable material. In some embodiments, a chemical vapor deposition process, a physical vapor deposition process (e.g., evaporation deposition or sputtering), an atomic layer deposition process, an electroplating process, a combination thereof, or another suitable process can be used to fill the second trench 116 with a conductive material to form the contact structure 120. In addition, a chemical mechanical polishing process or an etch-back process can be optionally performed to remove excessive insulating material or conductive material after the deposition of insulating material or conductive material.

In some embodiments, before filling the second trench 116 with the conductive material, an adhesion layer (not illustrated) can optionally be formed on the sidewall of the second trench 116. For example, the adhesion layer can include TiN, Ti, Ta, TaN, or another suitable conductive material. The adhesion layer can be formed using a physical vapor deposition process, an atomic layer deposition process, an electroplating process, or a combination thereof. The adhesion layer can be used to improve the adhesion between the conductive material and the sidewall of the trench, and can reduce the bad effects on the semiconductor device resulting from the diffusion of the conductive material.

As shown in FIG. 1G, the semiconductor structure 10 of the present disclosure includes a doped layer 108 and a contact structure 120 which is electrically connected to the doped layer 108. It is found that the coupled charges above the oxide layer 104 (e.g., charges which are formed when the voltage is applied to the bottom substrate of SOI substrate or when the voltage of the bottom substrate of SOI substrate is adjusted) can be discharged through the doped layer 108 and the contact structure 120, and thus the backside bias effect is reduced and the problems thereof can be solved.

Other embodiments of the present disclosure are described below. In the interest of simplicity and clarity, similar reference numerals and/or letters might be used for similar elements. The reference numerals or letters might be repeated in different embodiments, the repetition does not render particular relation between different embodiments and/or between different structures.

Figure 2:
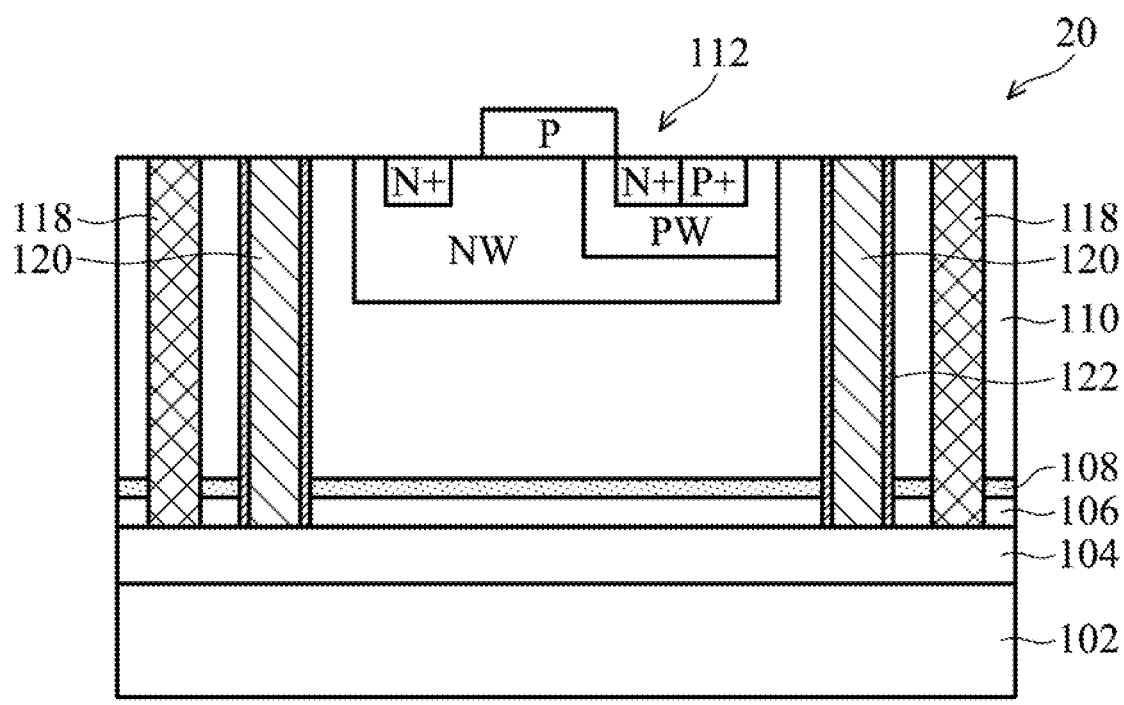
FIG. 2 is a cross-sectional view which illustrates a semiconductor structure according to some embodiments of the present disclosure.

FIG. 2 illustrates a semiconductor structure 20 of an embodiment of the present disclosure. The difference between the semiconductor structure 20 and the semiconductor structure 10 is that the sidewall of the contact structure 120 of the semiconductor structure 20 further includes a doped region 122. In some embodiments with N-type semiconductor devices 112, the doped region 122 has N-type dopants. For example, before the second trench 116 is filled by the conductive material, phosphorous ions or arsenic ions can be implanted around the sidewall of the second trench 116 to form the N-type doped region 122 with a dopant concentration of $10^{11}$-$10^{15}$ cm$^{-3}$ by suitable methods. In some embodiments with P-type semiconductor devices 112, the doped region 122 has P-type dopants. For example, before the second trench 116 is filled by the conductive material, boron ions, indium ions, or boron difluoride ions (BF2$^+$) can be implanted around the sidewall of the second trench 116 to form the P-type doped region 122 with a dopant concentration of $10^{11}$-$10^{15}$ cm$^{-3}$ by suitable methods. In some embodiments, a tilt implantation method is used such that the doped region 122 has a more uniform dopant distribution. In addition, the dopant concentration of the doped region 122 can be fine-tuned so that the doped region 122 and the contact structure 120 together can have a lower resistance.

Figure 3:
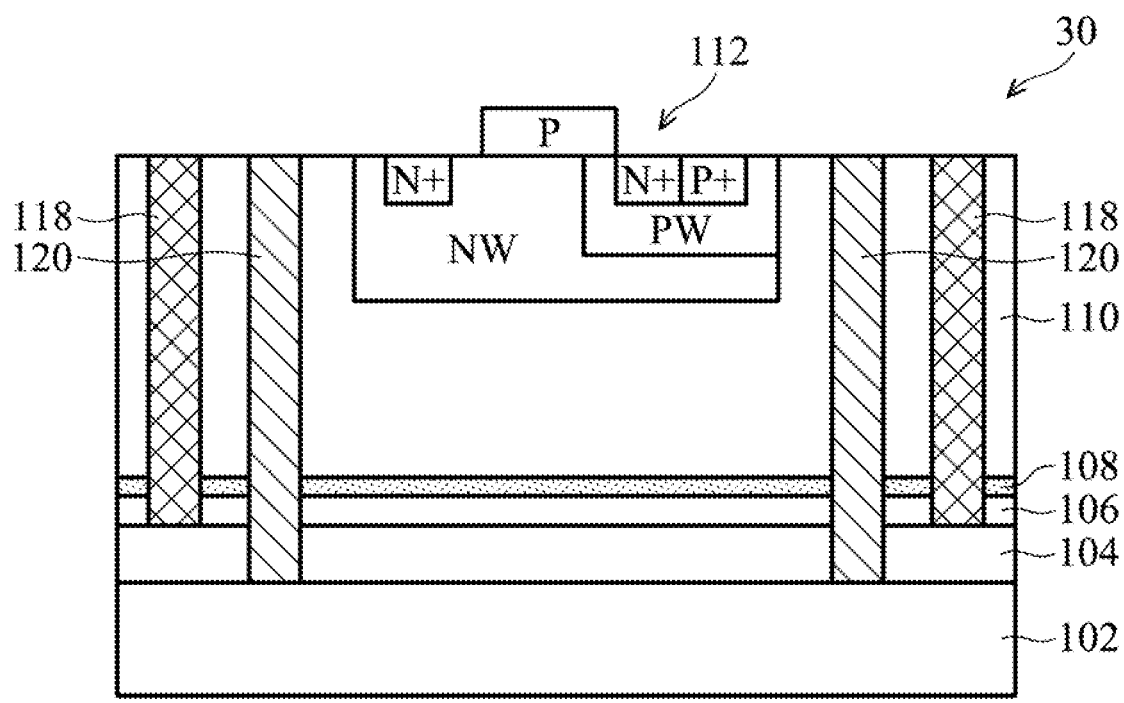
FIG. 3 is a cross-sectional view which illustrates a semiconductor structure according to some embodiments of the present disclosure.

FIG. 3 illustrates a semiconductor structure 30 of an embodiment of the present disclosure. The difference between the semiconductor structure 30 and the semiconductor structure 10 is that the contact structure 120 of the semiconductor structure 30 extends through the buried oxide layer 104 and is in direct contact with the top surface of the bottom substrate 102. In some embodiments, the contact structure 120 is electrically connected to a voltage source V which can provide or adjust the voltage of the bottom substrate 102 from the first side of the bottom substrate 102 through the contact structure 102, rather than from the second side of the bottom substrate 102. Thus, additional processes to form the contact structure in the bottom substrate can be omitted, and the cost can be reduced, and the flexibility of circuit layout can also be improved. It should be noted that the contact structure 120 of the semiconductor structure 30 is also electrically connected to the doped layer 108, and thus the backside bias effect is also reduced and the problems thereof can also be solved.

Figure 4:
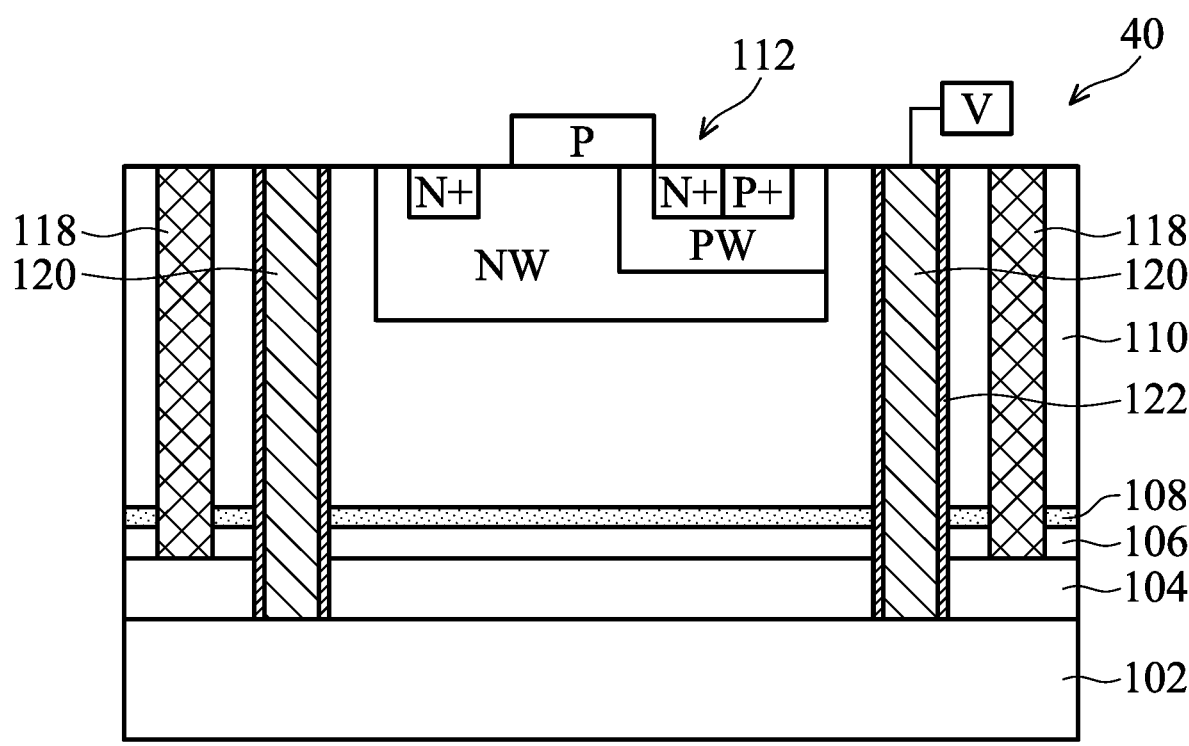
FIG. 4 is a cross-sectional view which illustrates a semiconductor structure according to some embodiments of the present disclosure.

FIG. 4 illustrates a semiconductor structure 40 of an embodiment of the present disclosure. The difference between the semiconductor structure 40 and the semiconductor structure 30 is that the semiconductor structure 40 further includes a doped region 122 similar to that of the semiconductor structure 20. Thus, the dopant concentration of the doped region 122 can also be fine-tuned so that the doped region 122 and the contact structure 120 together can have a lower resistance.

In summary, the semiconductor structures of the present disclosure can solve problems resulting from the back side bias effect through the doped layer and the contact structure being electrically connected to the doped layer, and the semiconductor structures of the present disclosure can also fulfill the requirements of providing or adjusting the voltage of the bottom substrate from the front side of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection is better determined by the claims.

What is claimed is:

1. A semiconductor structure, comprising:
   a semiconductor on an insulator (SOI) substrate comprising a bottom substrate, a buried oxide layer on the bottom substrate, and a semiconductor layer on the buried oxide layer;
   a doped layer embedded in the semiconductor layer and above the buried oxide layer;
   a contact structure extending into the semiconductor layer from a top surface of the semiconductor layer, wherein the contact structure is electrically connected to the doped layer;
   a semiconductor device disposed in the semiconductor layer and directly above the doped layer, wherein the semiconductor device is entirely spaced apart from the doped layer by the semiconductor layer, and the doped layer and the buried oxide layer are spaced apart by a portion of the semiconductor layer such that the doped layer does not contact the buried oxide layer, wherein the contact structure comprises a ring-shaped structure surrounding the semiconductor device; and
   a trench isolation structure extending through the doped layer, wherein the contact structure is between the trench isolation structure and the semiconductor device, and the trench isolation structure comprises a ring-shaped structure surrounding the contact structure, and the trench isolation structure is spaced apart from the contact structure by the semiconductor layer.

2. The semiconductor structure of claim 1, wherein the contact structure extends through the doped layer and is in direct contact with the buried oxide layer.

3. The semiconductor structure of claim 2, wherein the contact structure extends through the buried oxide layer and is in direct contact with a top surface of the bottom substrate.

4. The semiconductor structure of claim 3, wherein the contact structure is electrically connected to a voltage source to provide the bottom substrate with a voltage.

5. The semiconductor structure of claim 1, wherein the doped layer comprises an N-type dopant.

6. The semiconductor structure of claim 1, wherein the doped layer comprises a P-type dopant.

7. The semiconductor structure of claim 1, wherein the semiconductor device has a first conductive type, and a sidewall of the contact structure comprises another portion of the semiconductor layer which is doped with a dopant with the first conductive type to form a doped region.

8. The semiconductor structure of claim 7, wherein a dopant concentration of the doped layer is $10^{11}$-$10^{13}$ cm$^{-3}$, and a dopant concentration of the doped region is $10^{11}$-$10^{15}$ cm$^{-3}$.

9. The semiconductor structure of claim 7, wherein the doped region surrounds the contact structure and spaces apart the contact structure and the doped layer, and the doped region extends into the buried oxide layer from the top surface of the semiconductor layer.

10. The semiconductor structure of claim 1, wherein the semiconductor device comprises a field-effect transistor (FET), a diode, a complementary metal-oxide-semiconductor transistor (CMOS), or a combination thereof.

11. The semiconductor structure of claim 1, further comprising:
    an adhesion layer on a sidewall of the contact structure, wherein the adhesion layer comprises TiN, Ti, Ta, or TaN.

12. A method for manufacturing a semiconductor structure as set forth in claim 1, comprising:
    providing a semiconductor on an insulator substrate comprising a bottom substrate, a buried oxide layer on the bottom substrate, and a semiconductor layer on the buried oxide layer;
    forming a doped layer on the semiconductor layer;
    forming an epitaxial layer on the doped layer;
    forming a trench isolation structure extending through the doped layer; and
    forming a contact structure, wherein the contact structure extends into the epitaxial layer from a top surface of the epitaxial layer and is electrically connected to the doped layer.

13. The method for manufacturing a semiconductor structure of claim 12, wherein the contact structure extends through the doped layer and the semiconductor layer and is in direct contact with a top surface of the buried oxide layer.

14. The method for manufacturing a semiconductor structure of claim 13, wherein the contact structure extends through the buried oxide layer and is in direct contact with a top surface of the bottom substrate.

15. The method for manufacturing a semiconductor structure of claim 12, wherein formation of the doped layer comprises implanting an N-type dopant in the semiconductor layer.

16. The method for manufacturing a semiconductor structure of claim 12, wherein formation of the doped layer comprises implanting a P-type dopant in the semiconductor layer.

17. The method for manufacturing a semiconductor structure of claim 12, wherein formation of the trench isolation structure comprises
    forming a first trench extending from a top surface of the epitaxial layer into the epitaxial layer and through the doped layer; and
    filling an insulating material in the first trench;
    and wherein formation of the contact structure comprises
    forming a second trench extending from the top surface of the epitaxial layer into the epitaxial layer and through the doped layer; and
    filling a conductive material in the second trench.

18. The method for manufacturing a semiconductor structure of claim 17, wherein formation of the contact structure further comprises implanting an N-type dopant or a P-type dopant in the epitaxial layer adjacent to a sidewall of the second trench before filling the conductive material in the second trench.

19. The method for manufacturing a semiconductor structure of claim 12, further comprising:
    forming a semiconductor device in the epitaxial layer before forming the trench isolation structure, wherein the semiconductor device is above the doped layer, and the contact structure is between the trench isolation structure and the semiconductor device.

20. The method for manufacturing a semiconductor structure of claim 12, wherein formation of the trench isolation structure is before formation of the contact structure.

21. The semiconductor structure of claim 1, wherein a top surface of the doped layer has a first width, and the semiconductor device has a second width smaller than the first width.

* * * * *